US009515198B1

(12) United States Patent
Ning et al.

(10) Patent No.: US 9,515,198 B1
(45) Date of Patent: Dec. 6, 2016

(54) MAGNETIC-FIELD AND MAGNETIC-FIELD GRADIENT SENSORS BASED ON LATERAL SOI BIPOLAR TRANSISTORS

(71) Applicant: International Business Machines Corporation, Armonk, NY (US)

(72) Inventors: Tak H. Ning, Yorktown Heights, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/966,962

(22) Filed: Dec. 11, 2015

(51) Int. Cl.
| | |
|---|---|
| *G01R 33/09* | (2006.01) |
| *H01L 29/82* | (2006.01) |
| *H01L 29/735* | (2006.01) |
| *H01L 29/66* | (2006.01) |
| *H01L 27/12* | (2006.01) |
| *G01R 33/02* | (2006.01) |

(52) U.S. Cl.
CPC .............. *H01L 29/82* (2013.01); *G01R 33/02* (2013.01); *H01L 27/1203* (2013.01); *H01L 29/6625* (2013.01); *H01L 29/735* (2013.01)

(58) Field of Classification Search
CPC ............................. G01R 33/09; H01L 29/82
USPC ........................................................ 324/252
See application file for complete search history.

(56) References Cited

U.S. PATENT DOCUMENTS

| | | | |
|---|---|---|---|
| 4,369,406 A | 1/1983 | Soclof et al. |
| 4,700,211 A | 10/1987 | Popovic et al. |
| 5,446,307 A | 8/1995 | Lux et al. |
| 6,861,717 B2 | 3/2005 | Hauenstein |
| 8,981,442 B2 | 3/2015 | Zieren et al. |

FOREIGN PATENT DOCUMENTS

| | | |
|---|---|---|
| BG | 109714 A | 5/2008 |
| BG | 66235 B1 | 7/2012 |

(Continued)

OTHER PUBLICATIONS

Vinal et al, "Operating Principles of Bipolar Transistor Magnetic Sensors", IEEE 1984, IEEE Transactions on Electron Devices, vol. ED-31, No. 10, Oct. 1984, pp. 1486-1494.

(Continued)

*Primary Examiner* — Bot Ledynh
(74) *Attorney, Agent, or Firm* — Scully, Scott, Murphy & Presser, P.C.; Louis J. Percello, Esq.

(57) ABSTRACT

A lateral bipolar junction transistor (BJT) magnetic field sensor that includes a layout of two or more adjacent lateral BJT devices. Each BJT includes a semiconductor base region of a first conductivity type doping, a semiconductor emitter region of a second conductivity type doping and laterally contacting the base region; and a first semiconductor collector region of a second conductivity type doping contacting said base region on an opposite side thereof. A second collector region of the second conductivity type doping is also formed contacting the base region on the opposite side thereof in spaced apart relation with the first collector region. The first adjacent lateral BJT device includes the emitter, base and first collector region and the second adjacent lateral BJT device includes the emitter, base and second collector region. The sensor induces a detectable difference in collector current amounts in the presence of an external magnetic field transverse to a plane defined by the layout.

12 Claims, 5 Drawing Sheets

(56) References Cited

FOREIGN PATENT DOCUMENTS

| BG | 66281 B1 | 12/2012 |
| CN | 203658559 U | 6/2014 |
| RU | 2010 120 027 A | 11/2011 |
| RU | 2 515 377 C1 | 10/2014 |
| RU | 2013 151 149 A | 5/2015 |

OTHER PUBLICATIONS

Vinal et al., "Bipolar Magnetic Sensors", IEEE 1982, IEEE 1982 International Electronic Devices Meeting, (vol. 28), Dec. 13-15, 1982, pp. 308-311.

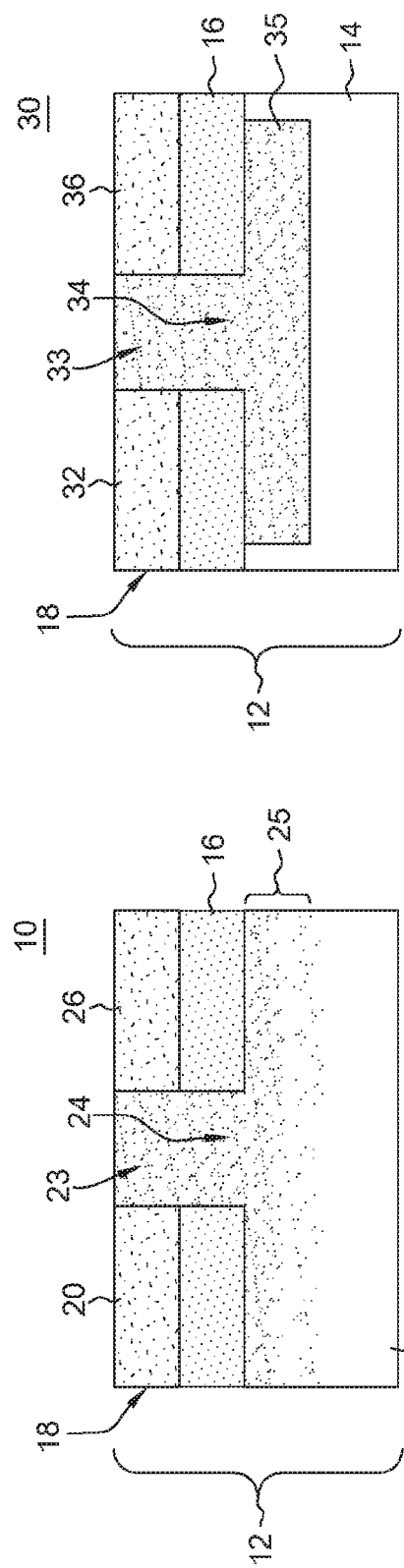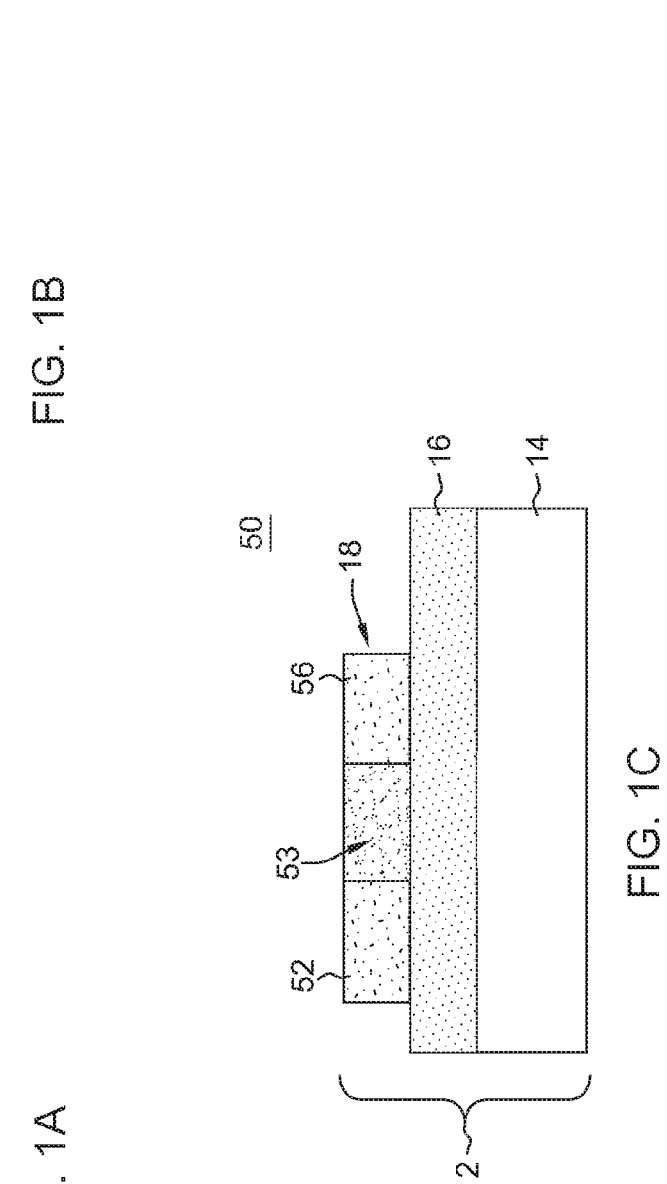
FIG. 1A
FIG. 1B
FIG. 1C

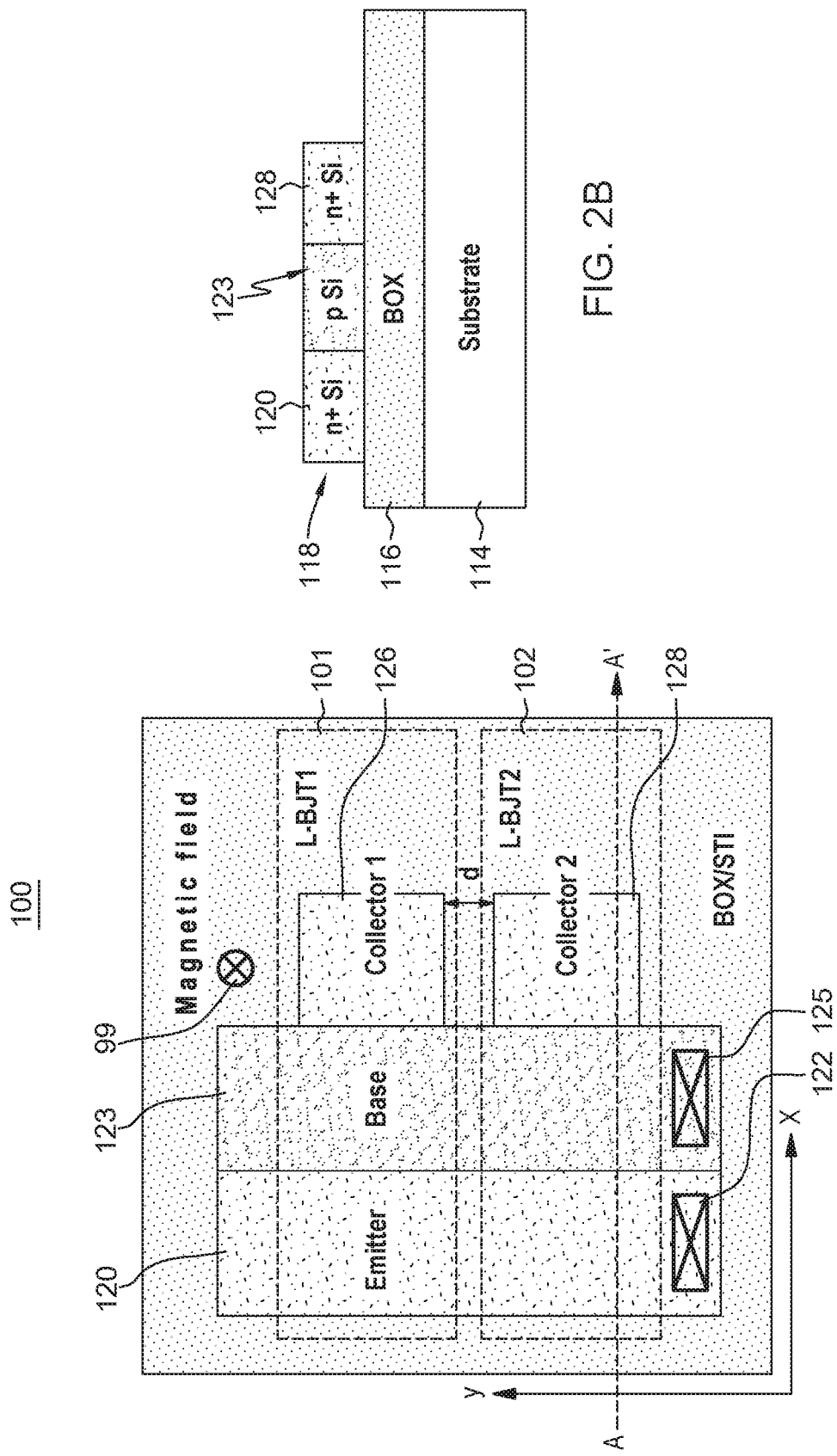

MAGNETIC-FIELD AND MAGNETIC-FIELD GRADIENT SENSORS BASED ON LATERAL SOI BIPOLAR TRANSISTORS

FIELD

The present disclosure relates generally to magnetic sensor devices, and in particular magnetic sensor based on SOI lateral bipolar transistors and its method of manufacture.

BACKGROUND

Traditionally in industry, sensing of magnetic field is utilized for control and measurement of: linear and rotary position sensing, gear tooth sensing, and current sensing. In such applications, however, relatively large magnetic fields are needed to avoid interference/error by background magnetic fields, such as the Earth's magnetic field, fields from ferromagnetic objects, and electromagnetic interference (EMI).

Solid-state magnetic sensors have received increasing attention given their inherent advantage in compactness and power efficiency when compared with traditional/complex counterparts such as search coil, flux gate, and superconducting quantum interference detectors (SQUID) and spin resonance magnetometers (the latter two usually need to be operated at low temperature for optimal sensitivity and resolution).

A typical solid-state magnetic sensor operates by converting the magnetic field sensed into a voltage or resistance. Given the nature of the solid-state sensor, the sensing can be conducted in an extremely small, e.g., lithographically patterned, area, which further reduces size and power requirements. The small size of a solid-state element increases the resolution for fields that change over small distances and allows for packaging arrays of sensors in a small enclosure.

Two conventional solid-state magnetic sensors commonly used today are AMR (anisotropic magnetoresistance) and GMR (giant magnetoresistance) devices. While appearing to be competitive in the power-cost comparison, the AMR (anisotropic magnetoresistive) and GMR (giant magnetoresistive) devices are fabricated with magnetic materials that are not as cost effective as Si. In addition, specific processes and dedicated facilities might be required for their fabrication, implying a finite floor of the lowest cost.

On the other hand, use of a vertical Bipolar Junction Transistor (BJT) on bulk Si as a magnetic sensor with potentially lower cost than AMR and GMR devices has been reported. (Vinal., et al. IEEE Transaction on Electron Device, Vol. ED-31, No. 10, p. 1486, 1984). However, the magnetic sensor based on bipolar transistor reported by Vinal is affected by parasitic current due to the vertical structure and subject to magnetic field attenuation near the emitter junction when the metal contact is too close.

BRIEF SUMMARY

In an aspect of the present disclosure, there is a magnetic sensor device based on SOI lateral Bipolar Junction Transistor elements that eliminates parasitic currents in magnetic sensors based on vertical BJT built on bulk Si.

In another aspect, there is a magnetic sensor device based on SOI lateral bipolar junction transistor elements that minimizes the attenuation of magnetic field in the vicinity of the emitter junction due to the presence of metal contact.

Further, there is provided a monolithic solution that can readily be integrated in magnetic sensors; and is configurable to measure the local magnetic field and/or the local magnetic field gradients.

Thus, in one embodiment, there is provided an SOI lateral bipolar junction transistor (BJT) magnetic sensor. The magnetic sensor comprises: a layout of two adjacent lateral BJT devices formed on a top semiconductor material layer comprising: a base region comprising a semiconductor material having a doping of a first conductivity type; an emitter region comprising a semiconductor material having a doping of a second conductivity type laterally contacting the base region and extending along a first side thereof; a first collector region of semiconductor material having a doping of the second conductivity type contacting the base region on a second side thereof; and a second collector region of semiconductor material having a doping of the second conductivity type contacting the base region on the second side thereof; the first collector region and the second collector region in spaced apart relation along the second side, the emitter, base and first collector regions forming a first adjacent lateral BJT device and the emitter, base and second collector regions forming a second adjacent lateral BJT device; wherein a presence of an external magnetic field transverse to a plane defined by the layout induces a difference in current between a first collector region of a first lateral BJT device of the layout and an adjacent second collector region of an adjacent second lateral BJT device of the layout, the difference in current used for determining a local magnetic field in the base region. That is, the difference in the first collector current and the second collector current is proportional to the magnetic field at a location in the base region between the first collector and the second collector.

In a further aspect, there is provided a method for forming a semiconductor structure including a lateral bipolar junction transistor (BJT). The method comprises: providing a silicon on insulator structure, the structure comprising an insulator layer formed atop a bottom semiconductor substrate, and having a top semiconductor layer formed on a top surface of the insulator layer, the top semiconductor layer having a doping of a first conductivity type; forming first and second trench isolation regions to define a base region of the top semiconductor layer of the first conductivity type doping; forming a top base contact structure including semiconductor material on a surface of the defined base region, the formed top base structure contact structure of semiconductor material having a doping of the first conductivity type; provide dielectric spacer structures at opposite sides of the base contact structure such that the dielectric spacer structures overlay respective opposite portions of the defined base region of the top semiconductor layer; converting a first region of the defined base region of the top semiconductor layer into an emitter region by introducing dopants of a second conductivity type that is the opposite of the first conductivity type into the defined base region underlying a first dielectric spacer structure, wherein a remaining portion of the base region portion laterally contacts the emitter region; and converting at least two second regions of the top segment portion of the top semiconductor layer into at least two collector regions by introducing dopants of the second conductivity type into the defined base region underlying an opposite side dielectric spacer structure, wherein each of the two collector regions are in spaced apart relation, and wherein a remaining portion of the base region laterally contacts each the at least two collector regions.

In still another aspect, there is provided a magnetic field gradiometer. The gradiometer comprises: a two-dimensional layout of first multiple adjacent SOI lateral bipolar junction transistor (BJT) devices and corresponding adjacent second multiple adjacent lateral BJT devices formed on a top semiconductor material layer of a silicon on insulator structure, the two-dimensional layout comprising: an emitter region comprising a semiconductor material having a doping of a first conductivity type; a first base region comprising a semiconductor material having a doping of a second conductivity type contacting the emitter region and extending along a first side thereof; a second base region comprising a semiconductor material having a doping of the second conductivity type contacting the emitter region and extending along a second side thereof; multiple first collector regions, each first collector region of semiconductor material having a doping of the first conductivity type and contacting the first base region at an opposite side, each first collector region formed in space apart relation with each other, wherein the emitter region, the first base region and the multiple first collector regions form respective first multiple adjacent lateral BJT devices of the layout; and multiple second collector regions, each second collector region of semiconductor material having a doping of the first conductivity type and contacting the second base region at an opposite side, each second collector region formed in space apart relation with each other, the emitter region, the second base region and the multiple second collector regions forming respective second multiple adjacent lateral BJT devices of the layout, wherein a presence of an external magnetic field transverse to a plane defined by the layout induces a difference in collector current between a pair of adjacent lateral BJT devices of said first multiple adjacent lateral BJT devices and a difference in collector current between a pair of adjacent lateral BJT devices of said second multiple adjacent lateral BJT devices, the difference in collector current from a pair of adjacent lateral BJT devices used for determining a local magnetic field in the base region between the pair of adjacent collectors, and local magnetic fields determined from two pairs of adjacent lateral BJT devices determining a local magnetic field gradient.

In still another aspect, there is provided a method of operating a magnetic sensor device. The method comprises: scanning a magnetic field gradiometer along one of a first axis or a second transverse oriented axis, the magnetic field gradiometer comprising: a two-dimensional layout of first multiple adjacent SOI lateral bipolar junction transistor (BJT) devices and corresponding adjacent second multiple adjacent lateral BJT devices formed on a top semiconductor material layer of a silicon on insulator structure, the two-dimensional layout defining an area between a first and a second transverse oriented axes, the layout comprising: an emitter region comprising a semiconductor material having a doping of a first conductivity type; a first base region comprising a semiconductor material having a doping of a second conductivity type contacting the emitter region and extending along a first side thereof; a second base region comprising a semiconductor material having a doping of the second conductivity type contacting the emitter region and extending along a second side thereof; multiple first collector regions, each first collector region of semiconductor material having a doping of the first conductivity type and contacting the first base region at an opposite side, each first collector region formed in space apart relation with each other, wherein the emitter region, the first base region and the multiple first collector regions form respective first multiple adjacent lateral BJT devices of the layout; and multiple second collector regions, each second collector region of semiconductor material having a doping of the first conductivity type and contacting the second base region at an opposite side, each second collector region formed in space apart relation with each other, the emitter region, the second base region and the multiple second collector regions forming respective second multiple adjacent lateral BJT devices of the layout; and wherein a presence of an external magnetic field transverse to a plane defined by the layout induces a difference in collector current between a pair of adjacent lateral BJT devices of said first multiple adjacent lateral BJT devices of the layout and a difference in collector current between a pair of adjacent lateral BJT devices of said second multiple adjacent lateral BJT devices of the layout, the difference in collector current from a pair of adjacent lateral BJT devices used for determining the local magnetic field in the base region between the pair of adjacent collectors, the local magnetic fields determined from two pairs of adjacent lateral BJT devices of the layout used to determine the local magnetic field gradient.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings:

FIG. 1A shows an SOI lateral bipolar inverted device 10 according to a prior art implementation;

FIG. 1B shows an SOI lateral bipolar inverted device 30 according to a prior art implementation;

FIG. 1C shows an SOI lateral bipolar device 50 according to a prior art implementation;

FIG. 2A shows an SOI Lateral-BJT (L-BJT) magnetic sensor including a layout of two adjacent lateral BJT devices L-BJT1 and L-BJT2 formed on a top semiconductor layer of an SOI substrate;

FIG. 2B shows a cross-sectional view of the SOI lateral BJT (L-BJT) magnetic sensor of FIG. 2A taken along line A-A';

DETAILED DESCRIPTION

Figure 3:
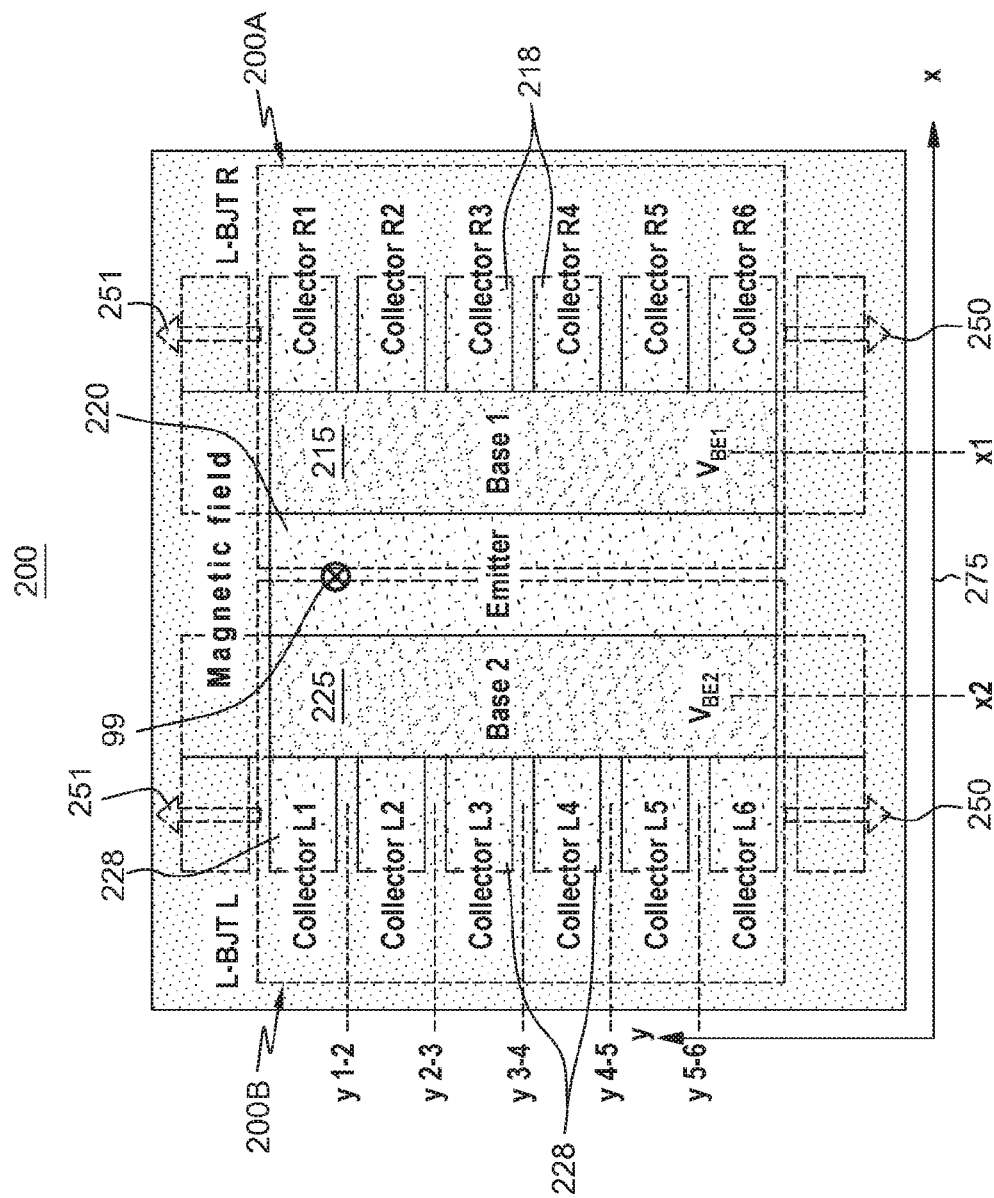
FIG. 3 depicts a magnetic field gradiometer 200 including a layout of multiple adjacent lateral BJT devices according to one embodiment.

The present application will now be described in greater detail by referring to the following discussion and drawings that accompany the present application. It is noted that the drawings of the present application are provided for illustrative purposes and, as such, they are not drawn to scale. In the drawings and the description that follows, like elements are referred to by like reference numerals. For purposes of the description hereinafter, the terms "upper", "lower", "right", "left", "vertical", "horizontal", "top", "bottom", and derivatives thereof shall relate to the components, layers and/or elements as oriented in the drawing figures which accompany the present application.

In one embodiment, the disclosure provides a magnetic sensor based on a Silicon-on-insulator (SOI) lateral BJT that is free from the parasitic current as seen in the vertical bulk BJT counterpart. The structure of the SOI lateral BJT also allows flexible placement of terminal metal contacts to minimize attenuation of magnetic field in the vicinity of the emitter junction, which limits the sensitivity/resolution of the sensor. A gradiometer is also provided that includes an integrated multi-sensor structure which can measure the magnetic field gradients in two directions in a plane.

In one aspect, there is provided a magnetic sensor based on SOI lateral BJT that: 1. eliminates parasitic currents in magnetic sensors based on vertical BJT built on bulk Si; and 2. minimizes the attenuation of magnetic field in the vicinity of the emitter junction due to the presence of metal contact; 3. provides a monolithic solution that can readily integrate magnetic sensors; and 4. is configurable to measure the local magnetic field and/or the local magnetic field gradients.

In one embodiment, the starting substrate is bulk-Si. In a further embodiment, the starting substrate may be semiconductor-on-insulator (SOI) substrate.

FIGS. 1A, 1B and 1C show different embodiments of a lateral BJT device with its emitter and collector regions form on a buried oxide region (BOX). That is, in each of the embodiments, the substrate 12 includes at least a stack of a semiconductor layer 18 and an insulator layer 16. For example, the substrate 12 of the lateral BJT device 50 shown in FIG. 1C can be a semiconductor-on-insulator (SOI) substrate including a stack of, from bottom to top, a handle substrate 14, an insulator layer 16 contacting a topmost surface of the handle substrate 14, and a top semiconductor layer 18 contacting the topmost surface of the insulator layer 16.

FIG. 1A shows a vertical cross-sectional view of an npn type bipolar junction transistor (BJT) 10 with an electrical contact region (labeled "B") to the base region 23 formed underneath the base region 23, and emitter ("E") and collector ("C") regions provided on a semiconductor material layer formed over a buried oxide. Compared to the lateral BJT of FIG. 1C, where the base region is contacted on the top surface of the base region, the lateral BJT of FIG. 1A, and where the base region is contacted from the bottom of the base region, is often referred as an inverted lateral BJT. While a lateral npn BJT transistor is shown in FIGS. 1A, 1B, and 1C, it is understood that the formed Lateral BJT Magnetic Sensor may include npn, pnp, or npn plus pnp type configurations on a same chip.

In the embodiment shown in FIG. 1A, the Magnetic Sensor based on Inverted Lateral BJT structure 10 includes a semiconductor material substrate 12 having a bulk doped Silicon substrate 14A, wherein the bulk substrate includes formed therein a region 25 having a certain dopant, e.g., in the case of npn transistor, p or p+-type material. This doped region forms a portion of an extrinsic base region underlying the BOX layer 16. The extrinsic base region 25 of a bipolar transistor is a doped semiconductor region, having the same dopant type as the intrinsic base region 23 of the transistor, providing electrical connection to the intrinsic base of the transistor. In one embodiment, p-type materials may include electrical dopants such as, for example, B, Al, Ga, In, and/or Tl. Formed above this doped substrate region 25, is the insulator layer 16, i.e., a layer of an oxide or nitride of Silicon, e.g., Silicon Oxide, $SiO_2$, SiN, at the like. Above oxide layer is formed semiconductor material layer, e.g., a layer 18 of polysilicon. The oxide layer 16 is located under (buried under) semiconductor layer 18, and is often referred to as a buried oxide or BOX layer. The thickness of substrate 12 include the thickness of semiconductor layer 18 which may range from between 20 nm to 200 nm thick, the thickness of buried oxide layer 16 which may range from between 20 nm to 200 nm thick, the thickness of doped semiconductor region 25 as which may range between 100 nm to 1000 nm thick, and the thickness of the handle substrate which may range from 20 micron to 700 micron thick. Although only one collector structure 26 is shown, as will be described, the device 10 will include at least two collector structures that contact the intrinsic base region and are spaced apart from each other so as to sense an electrical current differential in the presence of a magnetic field.

In the above formed polysilicon layer 18 for an npn lateral BJT lies a lateral orientation including a doped n-type emitter structure 20 and a doped n-type collector structure 26. As known, suitable n-type (or n+ type) electrical dopants can be, for example, P, As, and/or Sb. In between the emitter structure 20 and collector structure 26 lies a doped region of p-type material forming a base structure 23 having a p-type doped material portion 24 that extends through the BOX layer 16 and contacts the underlying p-type doped Si region 25 of substrate 14A. Base structure region 23, sandwiched between emitter region 20 and collector region 26, is often referred to as the intrinsic base region of the lateral BJT, while the doped portion 24 and the doped region 25 together are often referred to as the extrinsic base region of the lateral BJT. The extrinsic base region provides electric connection to the intrinsic base region and acts as the base terminal of the transistor. In typical bipolar transistors, the device characteristics are determined by the dimension and doping concentration of the intrinsic base region and independent of the extrinsic base region.

FIG. 1B shows a vertical cross-sectional view of a similar Magnetic Sensor based on Inverted Lateral BJT (e.g., npn type) as the embodiment of FIG. 1A. This device 30 includes a semiconductor layer 18 (e.g., polysilicon) having a lateral layout of BJT device base region 33, emitter 32 and collector 36 regions formed over a buried oxide layer 16. However, in this embodiment, the substrate 14 is a bulk native Silicon material and the base includes a defined doped region 35 within the bulk Si substrate underlying the BOX layer. This doped region 35 forms a portion of an extrinsic base region providing connection to the intrinsic base region 33. Thus, for the example inverted lateral npn transistor 30, the doped region 35 is a p-type or p+-type material. The formed base structure includes the intrinsic base region 33 sandwiched between emitter region 32 and collector region 36 and a p-type doped material portion 34 as the extrinsic base region that extends through the BOX layer 16 and contacts the underlying p+-type doped Si region 35 of substrate 14. Although only one collector structure 36 is shown, as will be described, the device 30 will include at least two collector structures that contact the intrinsic base region and are spaced apart from each other so as to sense an electrical current differential in the presence of a magnetic field.

FIG. 1C shows a further embodiment of a lateral BJT (e.g., npn type) magnetic sensor device 50. In the vertical cross-sectional view of device 50 shown in FIG. 1C, the BOX substrate 12 may include an insulating BOX layer 16 and a formed semiconductor structure (e.g., silicon on insulator or top silicon layer 18 having a lateral orientation including a doped n-type emitter structure 52, a doped n-type collector structure 56 and lying in between the doped region of p-type material forming an intrinsic base region 53. Unlike the prior lateral BJT structures, in the embodiment shown in FIG. 1C, this base region structure 53 does not extend through the buried insulator layer 16 to the underlying substrate. Nor is there an underlying base region of dopant within the substrate upon which the BOX layer is formed as in the embodiments of FIG. 1A, 1B. The intrinsic base region 53 is contacted on its top by a p-type doped semiconductor region (not shown) which forms an extrinsic base of the lateral BJT. Electrical contact (not shown) to the base region 53 may be formed on the top surface of the extrinsic base region.

The formed lateral BJT magnetic sensors shown in FIGS. 1A-1C, enhances detection sensitivity of magnetic field by eliminating parasitic current between emitter and base and collector and base. Device density is not limited by concern of magnetic field attenuation by metal contact of emitter junction, thereby preserving detection resolution.

FIG. 2A shows an SOI Lateral-BJT (L-BJT) magnetic sensor 100 including a layout of two adjacent lateral BJT devices, i.e., L-BJT1 101 and L-BJT2 102 formed on a top semiconductor layer 118 of a BOX substrate having an insulating layer 116 formed on underlying substrate 114. In the embodiment of FIG. 2, each L-BJT1 101 and L-BJT2 102 includes a common emitter structure 120 and a common adjacent base structure 123 that both extend in a first orientation and are common to both devices. The formed L-BJT1 device 101 includes a first collector structure 126 contacting the common base region 123 at one edge, while the formed adjacent L-BJT2 device 102 includes a second collector structure 128 contacting the common base region 123 at one edge. In the embodiment depicted, the first collector structure 126 and second collector structure 128 are spaced apart by a distance d, the distance d ranging from between 10 nm and 1000 nm. [please fill-in] As further shown in FIG. 2A, a metal contact via 122 is formed for electrical contact to emitter region 120. Likewise, a metal contact via 125 is formed for electrical contact to base region 123.

FIG. 2B shows a cross-sectional view of the SOI lateral BJT (L-BJT) magnetic sensor 100 of FIG. 2A taken along line A-A'. This view of the SOI lateral BJT (L-BJT) magnetic sensor 100 is similar to the cross-sectional view shown of the SOI lateral BJT (L-BJT) magnetic sensor device 50 depicted in FIG. 1C.

FIG. 2A further shows the SOI lateral BJT (L-BJT) magnetic sensor 100 in the presence of an external magnetic field 99 showing magnetic field lines transverse to the plane of the adjacent device layout. In the presence of a transverse external magnetic field 99, the charge carriers (electron in the case of an npn L-BJT) injected from the emitter 120 will be subject to the Hall effect. Thus, for the device 100 shown, there will be obtained a different base-emitter voltage, $V_{BE}$, in L-BJT1 device 101 as compared to the base-emitter voltage at adjacent L-BJT2 device 102, translating to current difference in the first collector structure 126 (Collector 1) versus the second collector structure 128 (Collector 2). That is, current flowing through $I_{C1}$ will not equal current flowing through $I_{C2}$, i.e., $I_{C1} I_{C2}$.

Thus, in one embodiment depicted in FIG. 2A, the magnitude of the external magnetic field can be calculated by the difference of $I_{C1}$ and $I_{C2}$ following known operating principles involving the Hall effect.

In one embodiment, the lateral BJT (L-BJT) magnetic sensor 100 device built on SOI eliminates parasitic current, ensuring good sensitivity and low power (due to elimination of parasitic current). Moreover, the device structure allows placement of metal contacts for emitter and base further away from the active emitter-base junction, thus avoiding proximity shielding effect by the emitter and base contact metal.

In a further embodiment, the lateral BJT (L-BJT) magnetic sensor 100 device may be extended to include multiple collector structures, thus rendering the configuration for use as a gradiometer to map magnetic field gradient in two dimensions, e.g., in a plane.

In the embodiment shown in FIG. 3, a magnetic field gradiometer 200 includes a sensor device structure such as shown in FIG. 3 including a layout of multiple adjacent lateral BJT devices configured with multiple collector regions for each carrying current for determining magnetic field gradients. In device 200, the multiple adjacent lateral BJT devices includes formed adjacent magnetic sensor devices including a Lateral BJT-right side (L-BJT R) layout 200A and lateral BJT left side (L-BJT L) layout 200B. The layout of L-BJT L and L-BJT R devices are shown extended back-to-back with a common emitter region 220 which forms a common terminal for all formed BJT devices. That is, in device 200, adjacent L-BJT R device layout 200A of multiple adjacent right side lateral BJT devices includes an emitter region 220, a formed base region 215 having one side contacting one side of the emitter 220 and including multiple collector regions or terminals labeled Collectors R1, R2, . . . , Rn 218 bordering the other side of base region 215. Adjacent L-BJT L device layout 200B of multiple adjacent left side lateral BJT devices includes the emitter region 220, a formed base region 225 bordering on an opposite side of the emitter region 220 and including a corresponding number of multiple collector regions or terminals Collectors L1, L2, . . . , Ln 228 bordering the other side of base region 225. In the embodiment of the magnetic field gradiometer 200 of FIG. 3, there are only shown six (6) left side Collectors L1-L6 and six right side Collectors R1-R6 shown —however, in larger gradiometer device embodiments, there could be many more Collectors 218, 228 formed. For example, in alternate embodiments, the gradiometer structure 200 can be extended back-to-back L-BJT's with a shared Emitter and multiple Collector terminals, which can be operated individually or simultaneously as shown by directions indicated by broken arrows 250, 251. The maximum number of collectors is limited only by the area of the starting substrate, or by the desired area for the magnetic field gradiometer chip. A local magnetic field gradient is determined using local magnetic fields determined from two pairs of adjacent lateral BJT devices.

In one embodiment shown, a layout of lateral BJT-left (L-BJT L) devices 200B and lateral right side devices (L-BJT R) 200A is shown against an X-Y axis 275. The layout further includes multiple collector regions 218 of L-BJT R devices 200A and multiple collectors 228 of L-BJT L devices 200B shown along a vertical Y-axis, and the horizontal width of the device 200 shown along a X-axis, e.g., from an origin of axis 275. For example, the layout of collectors may be identified in the grid shown as having lines along the Y-axis as lines y1-2 through line y5-6 where line y1-2 corresponds to a location between collector terminals Collector L1 and Collector L2 or between collector terminals Collector R1 and Collector R2; line y2-3 corresponds to a location between terminals Collector L2 and Collector L3 or between collector terminals Collector R2 and Collector R3; etc. Along the X-axis, highlighted locations include the line at x=x2 demarcating the middle of the base region of L-BJT L device 200B and the line at x=x1 demarcating the middle of the base region of L-BJT R device 200A.

Thus, in the example embodiment of magnetic field gradiometer 200 of FIG. 3, there is considered the L-BJT R (on the right side) transistors with Base 215 and Collectors R1 to R6. In the presence of a magnetic field, collector pair R1 and R2 measures the local magnetic field at (x1, y1-2), and the collector pair R5 and R6 measures the local magnetic field at (x1, y5-6), etc. Thus the L-BJT's on the right side can be used to measure the field and gradient along the y-axis at x1. A local magnetic field gradient is determined using local magnetic fields determined from two pairs of adjacent lateral BJT devices.

Further, in the example embodiment 200 of FIG. 3, there is considered the L-BJT L (left side) transistors with Base 225 and Collectors L1 to L6. In the presence of a magnetic field, collector pair L1 and L2 measures the local magnetic field at (x2, y1-2), and the collector pair L5 and L6 measures the local magnetic field at (x2, y5-6), etc. Thus, the L-BJT's on the left side can be used to measure the field and gradient along the y-axis at x2.

A 2D mapping of magnetic field and gradient can be generated by real-time simultaneous detection using the gradiometer 200 as shown, or an integrated array of such devices 200.

Thus, it is possible that the gradiometer sensor device 200 may be operated in one embodiment, by automatically or manually scanning the sensor along the x- or y-direction to acquire the magnetic field gradient along each direction separately instead of simultaneously.

Further, a structure integrated with multiple aligned arrays of such sensor devices 200 may be formed and operated for magnetic field sensing, e.g., by automatically or manually scanning the sensor along the x- or y-direction to generate a map of magnetic field and magnetic field gradient over the scanned area.

Figure 4:
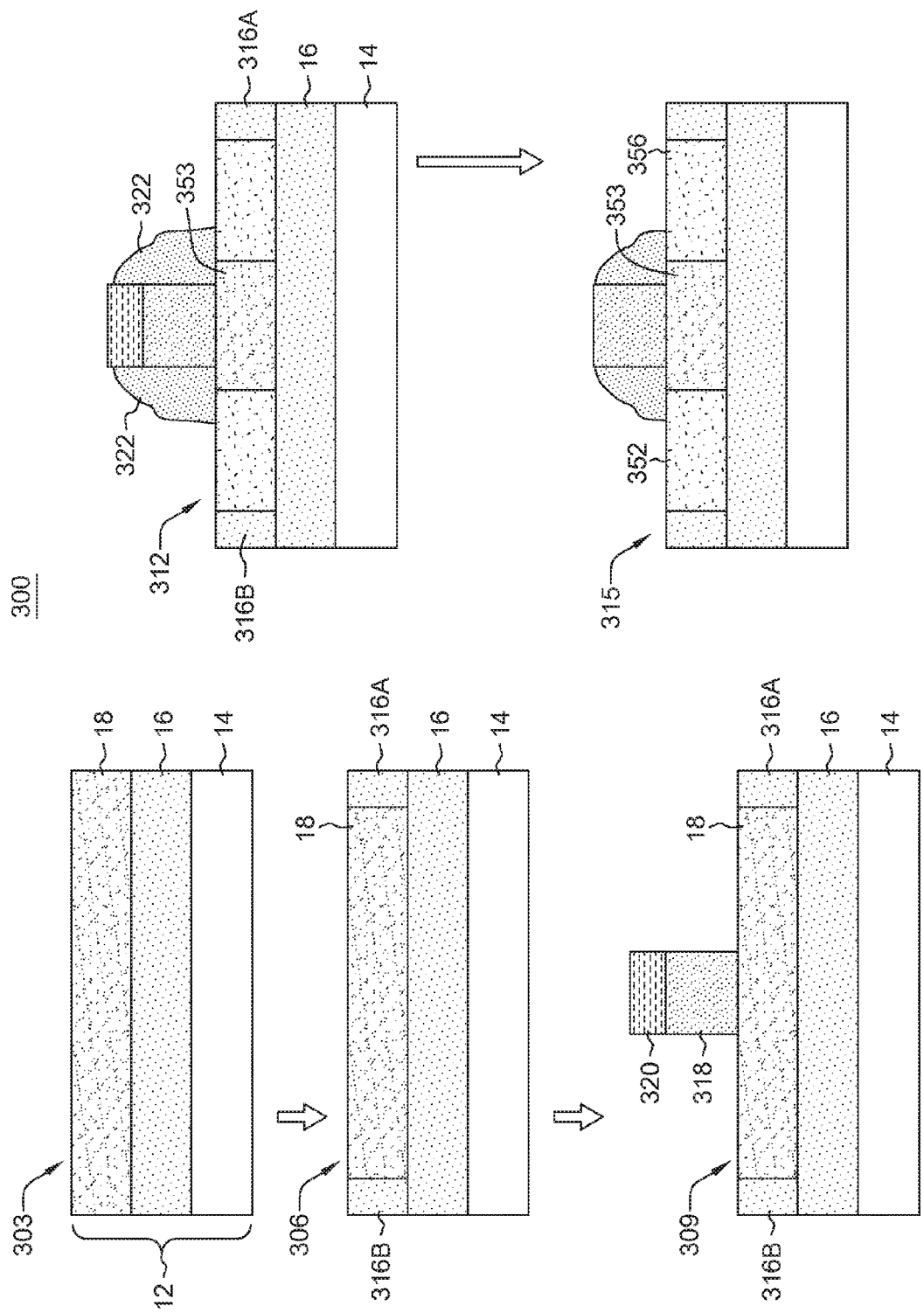
FIG. 4 depict semiconductor process steps for manufacturing the magnetic sensor device shown in FIGS. 2A, 2B and the gradiometer sensor of FIG. 3.

FIG. 4 depict semiconductor process steps 300 for manufacturing the sensor device shown in FIGS. 2A, 2B and the gradiometer sensor of FIG. 3.

As shown in FIG. 4, and depicted in cross-sectional views depicted in FIG. 1C, first process steps 303 including forming the substrate 12 utilizing techniques that are well known to those skilled in the art for forming SOI substrates, for example, a layer transfer process can be used to form the substrate 12 having handle substrate 14, buried insulator layer (BOX) 16 and top layer 18 that is shown in FIG. 1C.

The handle substrate 14 can include a semiconductor material, an insulator material, a conductor material, or a combination thereof. In one example, the handle substrate 14 can include a semiconductor material such as silicon or a silicon germanium alloy. If the handle substrate 14 includes a semiconductor material, the handle substrate 14 can be undoped or have a p-type doping or an n-type doping.

The insulator layer 16 includes a dielectric material such as silicon oxide and/or silicon nitride. For example, the insulator layer 16 can include thermal silicon oxide. The thickness of the insulator layer 16 can be from 5 nm to 1000 nm, and typically from 100 nm to 200 nm, although lesser and greater thicknesses can also be employed. The insulator layer 16 may, or may not, include multiple dielectric layers, e.g., a stack including at least a silicon oxide layer and a silicon nitride layer.

In one embodiment, as a result of further process steps 306, after providing the substrate 12 containing top semiconductor layer 18, dopants of a first conductivity type are introduced into regions of the top semiconductor layer 18. The concentration of dopants in layer 18 may range from $1 \times 10^{17}$ cm$^{-3}$ to $1 \times 10^{19}$ cm$^{-3}$. For an npn device, the top semiconductor layer 18 may be doped p-type by ion implantation, gas phase doping, plasma doping, or diffusion of electrical dopants from a disposable dopant source layer (such as a borosilicate glass layer). Trench isolation structures 316A, 316B may be formed at end portions of the top semiconductor layer 18. Each trench isolation structure that is formed has a bottommost surface that contacts a topmost surface of the insulator layer 16 of substrate 12. Also, each trench isolation structure that is formed includes a sidewall surface that contacts a sidewall surface of a remaining portion of the top semiconductor layer 18. Furthermore, each trench isolation structure that is formed would have a topmost surface that is coplanar with a topmost surface of a remaining portion of the top semiconductor layer 18.

Each trench isolation structure 316A, 316B can be formed utilizing a conventional trench isolation process. The trench isolation process includes forming a trench through top semiconductor layer 18 utilizing lithography and etching. Following trench formation, a trench dielectric material such as a trench dielectric oxide material can be formed into each trench. A densification process and/or a planarization process can follow the trench fill.

Referring to FIG. 4, there is shown a result of further process steps 309, in which there is first deposited a layer of material that forms an extrinsic base layer 318 and a stacked layer of material that forms a base cap layer 320 according to an embodiment of the present application. In one embodiment, the formed extrinsic base layer 318 and the base cap layer 320 are sequentially deposited over the top semiconductor layer 18. Then, after the stack of the base cap layer 320 and the extrinsic base layer 318 are patterned, for example, by applying and lithographically patterning a photoresist layer (not shown) and transferring the pattern in the patterned photoresist layer through the stack of the base cap layer 320 and the extrinsic base layer 318, a remaining portion of the base cap layer 320 is herein referred to as a base cap, and a remaining portion of the extrinsic base layer 318 is herein referred to as an extrinsic base region 318. The transfer of the pattern from the patterned photoresist layer to the stack of the base cap layer 320 and the extrinsic base layer 318 can be effected by an anisotropic etch, in which case the sidewalls of the extrinsic base region 318 is vertically coincident (coincident in a top-down view) with sidewalls of the base cap 320. Following the transfer of the pattern from the patterned photoresist layer to the stack of the base cap layer 320 and the extrinsic base layer 318, the patterned photoresist layer can be removed utilizing a conventional resist stripping process such as, for example, ashing.

As is shown, the bottommost surface of the extrinsic base region 318 is in direct contact with a topmost surface of the top semiconductor layer 18 over substrate 12.

Although the following description utilizes the structure shown in FIG. 2B, the exemplary semiconductor structures shown in FIGS. 2A, 3 can be subjected to the same processing steps.

In one embodiment, the extrinsic base layer 318 can be a doped semiconductor material layer having dopants of first conductivity type, which is the same dopant type as semiconductor layer 18. For an npn BJT device, the first conductivity type is p-type. The doped semiconductor material of the extrinsic base layer 318 and may be lattice matched to the top semiconductor layer 18 of the substrate. In one embodiment, the extrinsic base layer 318 includes a same or different semiconductor material than the top semiconductor layer 18. In one embodiment, the extrinsic base layer 318 can be polycrystalline or amorphous as deposited. In another embodiment, the top semiconductor layer 18 can be single crystalline, and the extrinsic base layer 318 can be epitaxially aligned to the top semiconductor layer 18, and correspondingly, single crystalline.

The extrinsic base layer 318 has a doping of p-type materials given the device is an npn device. The extrinsic base layer 318 can be in-situ doped during deposition, or can be deposited as an intrinsic (or lightly doped) semiconductor material layer and subsequently doped (or further doped) by ion implantation, gas phase doping, plasma doping, or diffusion of electrical dopants from a disposable dopant source layer (such as a borosilicate glass layer). In other embodiments, aphosphosilicate glass or arsenosilicate glass would be used for pnp bipolar junction devices. In one embodiment, the extrinsic base layer 318 may include p-type material dopants at a greater dopant concentration than the concentration of dopants within the top semiconductor layer 18. For example, the extrinsic base layer 318 includes dopants of the p-type material conductivity type at a dopant concentration from $1.0 \times 10^{19}/cm^3$ to $3.0 \times 10^{21}/cm^3$, although lesser and greater dopant concentrations can also be employed. In one embodiment, the extrinsic base layer 318 can include a doped polycrystalline material. The extrinsic base layer 318 can be deposited, for example, by chemical vapor deposition (CVD) or physical vapor deposition (PVD). The thickness of the extrinsic base layer 318 can be from 20 nm to 200 nm, although lesser and greater thicknesses can also be employed.

The base cap layer 320 includes a dielectric material such as silicon oxide, silicon nitride, silicon oxynitride, a dielectric metal oxide, or a combination thereof. The base cap layer 320 can be deposited, for example, by chemical vapor deposition (CVD). The thickness of the base cap layer 320 can be from 20 nm to 200 nm, although lesser and greater thicknesses can also be employed.

Referring to FIG. 4, there is illustrated the exemplary structure resulting from processing steps 312 that form a dielectric spacer 322 on each sidewall surfaces of the extrinsic base region 318 and surface portions of an exposed surface of the top semiconductor layer 18 that are proximal to the sidewall surfaces of the extrinsic base region 318.

The dielectric spacer 322 can be formed, for example, by conformal deposition of a dielectric material layer and subsequent anisotropic etch that removes the horizontal portions of the deposited dielectric material layer. The conformal deposition of the dielectric material layer can be performed, for example, by chemical vapor deposition (CVD), atomic layer deposition (ALD), or a combination thereof. The thickness of the dielectric spacer 322, as measured at the base that contact the top semiconductor layer 18, can be from 10 nm to 300 nm, although lesser and greater thicknesses can also be employed. The dielectric spacer 322 is of unitary construction (in a single piece), and laterally contacts the sidewall surfaces of the extrinsic base region 318 and the base cap 320. In one embodiment, the dielectric spacer 322 can include two layers, a first dielectric layer that is in contact with the sidewall surfaces of the extrinsic base region 318 and the exposed surface of the top semiconductor layer 18, and a second dielectric layer that lies on top of the first dielectric layer.

Dopants of a second conductivity type are introduced into regions of the top semiconductor layer 18 that are not covered by the dielectric spacer 322 and the stack of the extrinsic base region 318 and the base cap 320. The second conductivity type is the opposite of the first conductivity type. If the first conductivity type is p-type, the second conductivity type is n-type (and vice versa). The dopants of the second conductivity type can be introduced, for example, by ion implantation employing the combination of the dielectric spacer 322 and the stack of the extrinsic base region 318 and the base cap 320 as an implantation mask. An additional implantation mask (not shown) such as a patterned photoresist layer can also be employed if multiple devices (not shown) are present on the substrate 12.

Introduction of the dopants of the second conductivity type converts a first region of the top semiconductor layer 18 into an emitter region 352 and a second region of the top semiconductor layer 18 into a collector region 356. A remaining unimplanted region of the top semiconductor layer 18 constitutes a base region 353 of the first conductivity type that laterally contacts the emitter region 352 and the collector region 356. The conversion of two regions of the top semiconductor layer 18 into the emitter region 352 and the collector region 356, respectively, may be performed simultaneously. Each of the emitter region 352 and the collector region 356 laterally contacts the base region 353 upon formation. Since the L-BJT devices in a magnetic field sensor or in a magnetic field gradiometer are identical, all the devices in a sensor or in a gradiometer are fabricated simultaneously in one fabrication process.

In one embodiment, the emitter region 352 and the collector region 356 can have a same dopant concentration of dopants of the second conductivity type. The net dopant concentration of dopants of the second conductivity type, i.e., the concentration of the dopants of the second conductivity type less the concentration of dopants of the first conductivity type, in the emitter region 352 and the collector region 356 can be, for example, from $1.0 \times 10^{19}/cm^3$ to $3.0 \times 10^{20}/cm^3$, although lesser and greater dopant concentrations can also be employed. In another embodiment, a masking layer (not shown) can be employed to provide a net dopant concentration of dopants of the second conductivity type for the emitter region 352 that is different from a net dopant concentration of the second conductivity type for the collector region 356.

Referring to FIG. 4, there is illustrated the resultant structure after performing further process steps 315 that includes the optional removal of the base cap structure 320, leaving exposed a top surface of external base region 318.

Although not shown, it is understood that there may be further formed various metal contact structures (not shown) to the extrinsic base, and the emitter and collector regions in subsequent layers that avoid interfering with and influencing any externally applied magnetic field. For example, referring to FIG. 2A, the metal contacts to the emitter 120 and to the base 123 can be located in the y-direction, e.g., above collector 126 or below collector 128. In this way, the flow of electrons (for npn devices) from the emitter into the base towards the collectors are not interfered by the metal contacts to the emitter 120 and to the base 123.

Figure 5:
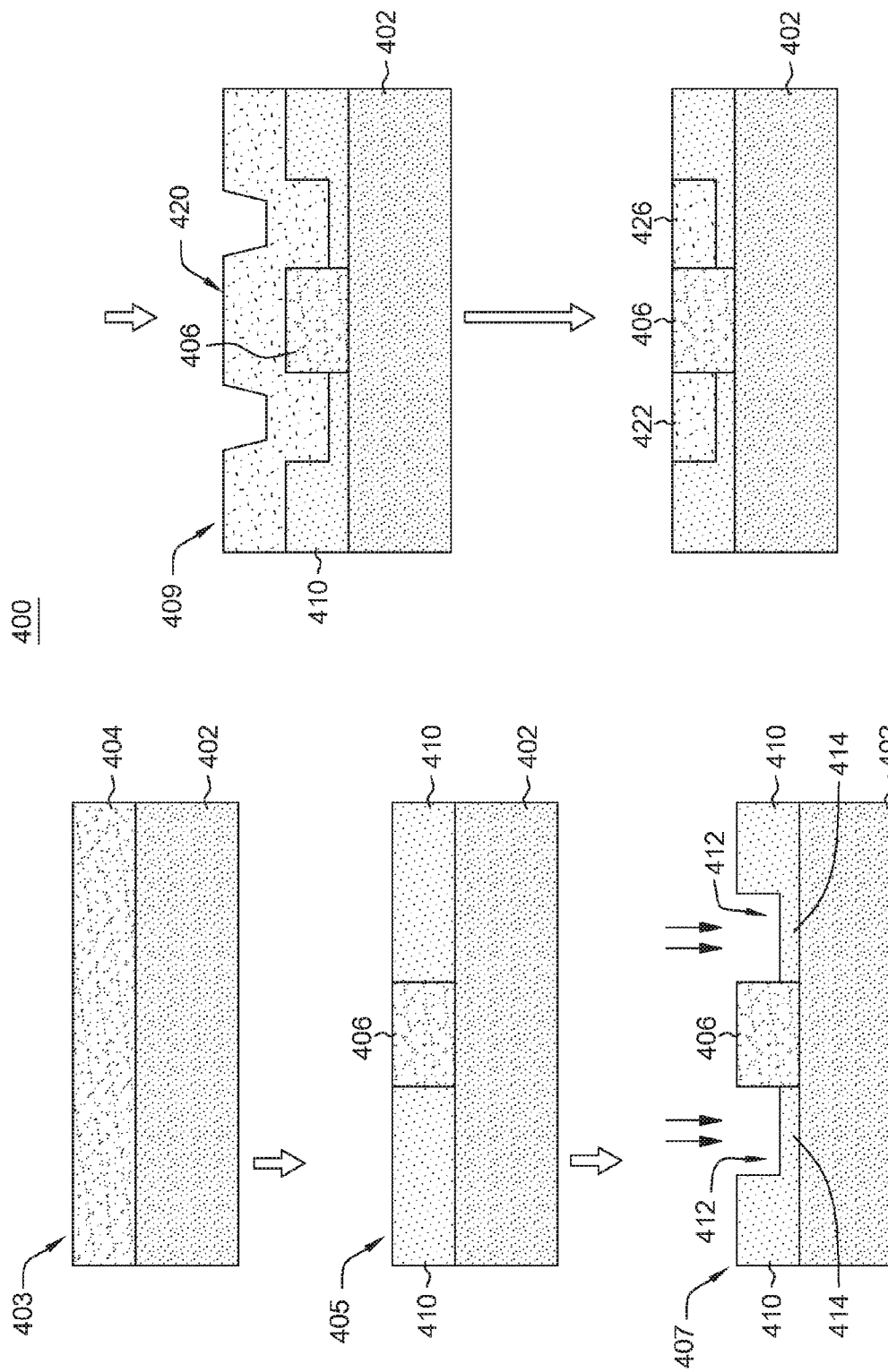
FIG. 5 depicts alternative semiconductor process steps for manufacturing the magnetic sensor device of FIG. 2A and the gradiometer sensor of FIG. 3.

FIG. 5 depict alternate semiconductor process steps 400 for manufacturing the sensor device shown in FIG. 2A and the gradiometer sensor of FIG. 3 using the L-BJT device structures shown in FIGS. 1A and 1B.

Referring to FIG. 5, a first exemplary semiconductor structure 403 is formed resulting from applied process steps in a silicon layer 404 is formed on a top surface of a silicon layer 402. In one embodiment, assuming an npn BJT-type transistor is to be made, the layer 402 can be, for example, a pre-doped bulk silicon semiconductor layer in a silicon semiconductor wafer substrate. The layer 402 can be a layer covering an entire silicon semiconductor wafer substrate doped with dopants of the same conductivity type as layer 402. In this case, the resulting L-BJT devices would be as shown in FIG. 1A. Alternately, the layer 402 can be a patterned doped region formed in an undoped substrate, or in a substrate lightly doped with dopants of the opposite type as layer 402. In this case, the resulting L-BJT devices would be as shown in FIG. 1B. For an npn type BJT device, the bottom layer 402 may be doped a first conductivity type, e.g., p-type or p+-type dopants, and provided as a doped single crystalline silicon layer. The first conductivity type can be p-type or n-type. If the bottom layer 402 is a doped single crystalline silicon layer, the dopant concentration in the bottom layer 402 can be from $1.0 \times 10^{18}/cm^3$ to $3.0 \times 10^{20}/cm^3$, although lesser and greater dopant concentrations can also be employed.

In one embodiment, the doped layer 402 used in the present embodiment may be made from any of several known semiconductor materials such as, for example, silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials. Typically the doped layer 402 may have a thickness ranging from 50 nm to 500 nm, although lesser or greater thickness can also be employed. The doped layer 402 is formed on top of a handle bulk substrate (not shown in FIG. 5) which may have a thickness ranging from 0.5 mm to about 1.5 mm.

Referring to FIG. 5, at least one additional top semiconductor layer 404 may be epitaxially grown on the doped silicon layer 402. Epitaxially grown layer 404 on a layer 402 is preferably doped in-situ with first conductivity type dopants, although doping after epitaxial growth is also possible. The concentration of dopants in layer 404 may range from between $1 \times 10^{17}$ cm$^{-3}$ and $1 \times 10^{19}$ cm$^{-3}$.

In the embodiment of FIG. 5, after providing the top doped polysilicon layer 404, further photolithographic processing results in a structure 405 having isolation regions 410 formed at end portions of the top layer 404. Each isolation region 410 that is formed has a bottommost surface that contacts a topmost surface of the doped silicon layer 402. Also, each isolation structure that is formed would have a sidewall surface that contacts a sidewall surface of a remaining portion 406 of the top doped layer 404. Furthermore, each isolation structure that is formed would have a topmost surface that is coplanar with a topmost surface of a remaining portion 406 of the top doped layer 404. The remaining portion 406 forms the base region of the inverted lateral BJT device such as shown in FIGS. 1A, 1B.

Each isolation structure 410 can be formed utilizing a conventional trench isolation process, e.g., by utilizing lithography, etching and trench isolation filling. In one embodiment, the isolation trench regions are formed as follows: A patterned masking layer (not shown) is first formed on the surface of structure 403 exposing underlying portions. Isolation trenches are then etched into the exposed portions of the substrate utilizing a conventional dry etching process such as reactive-ion etching (RIE) or plasma-etching. A CVD or another like deposition process is employed to fill the trenches with silicon oxide or another like trench dielectric material. That is, following trench formation, a dielectric material such as a dielectric oxide, e.g., $SiO_2$ material, or a dielectric Nitride, e.g., $Si_3N_4$, can be formed into each trench. A densification process and/or a planarization process can follow the trench fill.

In the embodiment of FIG. 5, a further structure 407 results from further conventional photolithography and etching techniques wherein a portion of each insulator structure 410 is removed, i.e., via an etching process, to form openings 412 in each insulator structure 410. Each opening 412 is formed adjacent a respective sidewall surface of the remaining top silicon layer 406. The formed openings 412 do not extend to the surface of the underlying doped layer 402, but rather a thin insulating material layer 414 remains atop the doped layer 402 at each opening 412. The thickness of insulating material layer 414 may range from 20 nm to 200 nm, although lesser or greater thickness may be used.

In one embodiment, each opening 412 can be formed by applying a mask layer (not shown) over the isolation structures 410 and doped silicon portion 406, and lithographically patterning the mask layer to form the openings therein. The pattern of the opening in the mask layer is transferred through the isolation structures 410 to form the openings 412. In one embodiment, an anisotropic etch, such as RIE, may be performed to selectively remove a portion of each insulator structure 410 that is exposed by the opening, while the silicon portion 406 remains. Fluorine containing gases, e.g. $CHF_3$, may be used for the selective RIE process.

In the embodiment of FIG. 5, a structure 409 results from further conventional photolithography and deposition steps that include the depositing of a semiconductor material within each opening 412 to a thickness that extends above the remaining top surfaces of the insulator structures 410 and the doped silicon portion 406 to form a top semiconductor material layer 420. This semiconductor material layer 420 may be deposited, for example, by chemical vapor deposition (CVD) or physical vapor deposition (PVD) and is formed to a thickness of about 50 nm to 500 nm.

Formed semiconductor material layer 420 is further doped of an opposite conductivity type as the doped silicon portion 406. Thus, given a p-type doped silicon portion 406, deposited material layer 420 may be doped with second conductivity type n or n+-type dopants, e.g., during deposition, although ion implantation doping techniques may occur after deposition. The concentration of n+-type dopants in layer 420 may range from between $1 \times 10^{19}$ cm$^{-3}$ and $3 \times 10^{20}$ cm$^{-3}$.

In the embodiment of FIG. 5, a structure 411 results from further conventional photolithography and etching steps to selectively remove portions of the doped polysilicon layer 420 so as to form collector region 422 and emitter region 426. It should be noted that a single etching process may be employed in removing portions of the polysilicon layer 420, or separate etching steps may be employed in removing this layer. For example, chemical mechanical polish (CMP) process may be used to planarize the structure 409 to result in the structure 411. The formed collector region 422, emitter region 426, and adjacent formed base region 406 results in an inverted lateral BJT devices for use in the embodiments of FIGS. 1A, 1B. Since the L-BJT devices in a magnetic field sensor or in a magnetic field gradiometer are identical, all the devices in a sensor or in a gradiometer are fabricated simultaneously in one fabrication process.

Although not shown, it is understood that there may be further formed various metal contact structures (not shown) to the extrinsic base, and the emitter and collector regions in subsequent layers that avoid interfering with and influencing any externally applied magnetic field. For example, referring to FIG. 2A, the metal contacts to the emitter 120 and to the base 123 can be located in the y-direction above collector 1 or below collector 2. In this way, the flow of electrons (for npn devices) from the emitter into the base towards the collectors are not interfered by the metal contacts to the emitter 120 and to the base 123.

While various embodiments are described herein, it will be appreciated from the specification that various combinations of elements, variations or improvements therein may be made by those skilled in the art, and are within the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An SOI lateral bipolar junction transistor (BJT) magnetic field sensor comprising:
a layout of two adjacent lateral BJT devices formed on a top semiconductor material layer comprising:
a base region comprising a semiconductor material having a doping of a first conductivity type;
an emitter region comprising a semiconductor material having a doping of a second conductivity type laterally contacting said base region and extending along a first side thereof;
a first collector region of semiconductor material having a doping of the second conductivity type contacting said base region on a second side thereof; and
a second collector region of semiconductor material having a doping of the second conductivity type contacting said base region on the second side thereof; said first collector region and said second collector region in spaced apart relation along said second side, said emitter, base and first collector regions forming a first adjacent lateral BJT device and said emitter, base and second collector regions forming a second adjacent lateral BJT device;
wherein a presence of an external magnetic field transverse to a plane defined by the layout induces a difference in current between a first collector region of a first lateral BJT device of said layout and an adjacent second collector region of an adjacent second lateral BJT device of said layout, said difference in current used for determining a local magnetic field in the base region.

2. The SOI lateral magnetic field sensor of claim 1 wherein said external magnetic field transverse to the plane defined by the formed first lateral and second lateral BJT devices induce a presence of the charge carriers resulting in a different base-emitter voltage at a first lateral BJT device as compared to a base-emitter voltage at second lateral BJT device resulting in said current difference at their respective collector regions.

3. The SOI lateral magnetic field sensor of claim 1, wherein said silicon on insulator structure includes an insulator layer formed atop a bottom semiconductor substrate, and a portion of said bottom semiconductor substrate has a doping of said first conductivity type, wherein said base region semiconductor material contacts said bottom semiconductor substrate of said first conductivity type doping and extends vertically through said insulator layer.

4. The SOI lateral magnetic field sensor of claim 3, wherein said base region semiconductor material has a top surface extending co-planar with top surfaces of said first collector region and said second collector regions and said emitter region.

5. The SOI lateral magnetic field sensor of claim 2, further comprising:
a first metal contact structure for contacting said emitter region;
a second metal contact structure for contacting said base region,
wherein said first and second metal contact structures are formed at a distance away from an active emitter-base junction to avoid proximity shielding effect by the emitter and base contact metal structures.

6. The SOI lateral magnetic field sensor of claim 3, wherein said emitter region, said first collector region and said second collector region have a same dopant concentration of dopants of said second conductivity type.

7. A magnetic field gradiometer comprising:
a two-dimensional layout of first multiple adjacent SOI lateral bipolar junction transistor (BJT) devices and corresponding adjacent second multiple adjacent lateral BJT devices formed on a top semiconductor material layer of a silicon on insulator structure, the two-dimensional layout comprising:
an emitter region comprising a semiconductor material having a doping of a first conductivity type;
a first base region comprising a semiconductor material having a doping of a second conductivity type contacting said emitter region and extending along a first side thereof;
a second base region comprising a semiconductor material having a doping of the second conductivity type contacting said emitter region and extending along a second side thereof;
multiple first collector regions, each first collector region of semiconductor material having a doping of the first conductivity type and contacting said first base region at an opposite side, each first collector region formed in space apart relation with each other, wherein said emitter region, said first base region and said multiple first collector regions form respective first multiple adjacent lateral BJT devices of said layout; and
multiple second collector regions, each second collector region of semiconductor material having a doping of the first conductivity type and contacting said second base region at an opposite side, each second collector region formed in space apart relation with each other, said emitter region, said second base region and said multiple second collector regions forming respective second multiple adjacent lateral BJT devices of said layout,
wherein a presence of an external magnetic field transverse to a plane defined by the layout induces a difference in collector current between a pair of adjacent lateral BJT devices of said first multiple adjacent lateral BJT devices and a difference in collector current between a pair of adjacent lateral BJT devices of said second multiple adjacent lateral BJT devices, the difference in collector current from a pair of adjacent lateral BJT devices used for determining a local magnetic field in the base region between the pair of adjacent collectors, and local magnetic fields determined from two pairs of adjacent lateral BJT devices determining a local magnetic field gradient.

8. The magnetic field gradiometer of claim 7 wherein said external magnetic field transverse to the plane defined by the two-dimensional layout induce a presence of the charge carriers resulting in a different base-emitter voltage at a first lateral BJT device as compared to a base-emitter voltage at second lateral BJT device resulting in said current difference at their respective collector regions.

9. The magnetic field gradiometer of claim 8, wherein said silicon on insulator structure includes an insulator layer formed atop a bottom semiconductor substrate, and a portion of said bottom semiconductor substrate has a doping of said second conductivity type, wherein said first base region semiconductor material and second base region semiconductor material both contact said bottom semiconductor substrate of said first conductivity type doping and extends vertically through said insulator layer.

10. The magnetic field gradiometer of claim 9, wherein said first base region of semiconductor material and said second base region of semiconductor material has a top surface extending co-planar with top surfaces of said emitter region and each top surfaces of first collector regions and said second collector regions.

11. The magnetic field gradiometer of claim 8, further comprising:
   a first metal contact structure for contacting said emitter region;
   a second metal contact structure for contacting said first base region, and a third metal contact structure for contacting said second base region,
   wherein said first, second and third metal contact structures are formed at a distance away from an active emitter-base junction to avoid proximity shielding effect by the emitter and base contact metal structures.

12. The magnetic field gradiometer of claim 9, wherein said emitter region, said first multiple collector regions and said second multiple collector regions each have a same dopant concentration of dopants of said first conductivity type.

* * * * *